(12) United States Patent
Nie et al.

(10) Patent No.: US 10,720,109 B2
(45) Date of Patent: *Jul. 21, 2020

(54) ORGANIC LIGHT EMITTING DIODE DISPLAY DEVICE

(71) Applicant: Shenzhen China Star Optoelectronics Semiconductor Display Technology Co., Ltd., Shenzhen, Guangdong (CN)

(72) Inventors: Chenglei Nie, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 13 days.

This patent is subject to a terminal disclaimer.

(21) Appl. No.: 15/577,160

(22) PCT Filed: Oct. 26, 2017

(86) PCT No.: PCT/CN2017/107826
§ 371 (c)(1),
(2) Date: Nov. 27, 2017

(87) PCT Pub. No.: WO2019/033553
PCT Pub. Date: Feb. 21, 2019

(65) Prior Publication Data
US 2019/0057658 A1    Feb. 21, 2019

(51) Int. Cl.
*G09G 3/3266*    (2016.01)
*G09G 3/3275*    (2016.01)
*H01L 27/32*    (2006.01)

(52) U.S. Cl.
CPC ......... *G09G 3/3266* (2013.01); *G09G 3/3275* (2013.01); *H01L 27/3276* (2013.01); *G09G 2300/0408* (2013.01); *G09G 2300/0426* (2013.01); *G09G 2310/0278* (2013.01); *H01L 2251/533* (2013.01); *H01L 2251/5315* (2013.01)

(58) Field of Classification Search
CPC .......................... G09G 3/3266; G09G 3/3275
See application file for complete search history.

(56) References Cited

U.S. PATENT DOCUMENTS

| 2012/0313907 | A1  | 12/2012 | Yamazaki |
| 2016/0163778 | A1  | 6/2016 | Wang et al. |
| 2017/0069280 | A1* | 3/2017 | Xu .......................... G09G 3/20 |

FOREIGN PATENT DOCUMENTS

| CN | 101666951 A | 3/2010 |
| CN | 104134429 A | 11/2014 |
| CN | 104360558 A | 2/2015 |
| CN | 104614911 A | 5/2015 |

* cited by examiner

*Primary Examiner* — Sepehr Azari

(57) ABSTRACT

An organic light emitting diode (OLED) display device includes a plurality of scan lines, a plurality of data lines, and a driver chip. The scan lines are configured to receive scan signals. The data lines are configured to receive data signals. The driver chip is connected with the scan lines and the data lines, and configured to generate the scan signals and the data signals. A plurality of connection lines that are connected the driver chip with the data lines and scan lines are led out from a side of the driver chip.

16 Claims, 3 Drawing Sheets

ORGANIC LIGHT EMITTING DIODE DISPLAY DEVICE

BACKGROUND

Field

The present disclosure relates to a technical field of display devices, and more particularly to an organic light emitting diode (OLED) display device.

Background

Organic light-emitting diode (OLED) devices serve as a novel flat panel display technology, and have characteristics of being active light emitting, having wide viewing angles, high response speed, and flexible, such that OLED devices can be widely used, and have become promising next-generation display technology. Based on driving modes, the OLED display devices are divided into two display types of an active matrix organic light-emitting diode (AMOLED) in an active driving mode and a passive matrix organic light-emitting diode (PMOLED) in a passive driving mode.

The active driving mode of AMOLED is used in the OLED display devices used in mobile phones and the flat television sets. In the active driving mode, each sub-pixel of the display device is arranged by a thin film transistor (TFT) having a switch function and a storage capacitor. In additions, many gate lines, data input lines, and power supply lines are disposed around a display region. Because the gate lines, data input lines, and power supply lines are distributed on a periphery of the display device to form a frame region, this creates a larger frame region of the display device.

Therefore, it is necessary to provide an OLED display device to solve above-mentioned problems in related art.

SUMMARY OF DISCLOSURE

Embodiments of the present disclosure provide an organic light emitting diode (OLED) display device for decreasing a frame size of the display device. In addition, the OLED display device can improve connection stability of signal lines.

To solve the above-mentioned problems, the present disclosure provides following solutions.

In a first embodiment, an organic light emitting diode (OLED) display device includes a plurality of scan lines, a plurality of data lines, and a driver chip. The scan lines are configured to receive a scan signal. The data lines are configured to receive a data signal. The driver chip is connected with the scan lines and the data lines, and is configured to generate the scan signal and the data signal. A plurality of connection lines connected the driver chip with the data lines and scan lines are led out from a side of the driver chip. The driver chip includes a plurality of driving units that are arranged on a same side of the OLED display device. The driving units include at least one primary driving unit and at least one secondary driving unit. The at least one primary driving unit and the at least one secondary driving unit are symmetrically arranged based on a central axis along a vertical direction of the display device.

In one embodiment of the OLED display device, the driver chip comprises a source driver configured to output the data signal, and a gate driver configured to output the scan signal, wherein the data lines are connected with the source driver, and the scan lines are connected with the gate driver.

In one embodiment of the OLED display device, the connection lines include a plurality of scan connection lines, and each scan connection line comprises a horizontal portion parallel to the scan lines, and a vertical portion parallel to the data lines.

In one embodiment of the OLED display device, the connection lines include a plurality of scan connection lines for connecting the driver chip with the scan lines, a plurality of first terminals of the scan connection lines are connected with the driver chip, and a plurality of second terminals of the scan connection lines are connected with the scan lines.

In one embodiment of the OLED display device, each of the scan lines corresponds to a primary driving unit and a secondary driving unit, the at least one primary driving unit is connected with a scan line through a primary scan connection line, and the at least one secondary driving unit is connected with the scan line through a secondary scan connection line, wherein a first terminal of the scan line is connected with a terminal of the primary scan connection line, and a second terminal of the scan line is connected with a terminal of the secondary scan connection line.

In one embodiment of the OLED display device, the secondary scan connection line and the primary scan connection line are symmetrically arranged based on the central axis along the vertical direction of the display device.

In one embodiment of the OLED display device, a type of the OLED display device comprises a top emitting type or a bottom emitting type.

In one embodiment of the OLED display device, the driver chip is an integrated chip that outputs the scan signal and the data signal.

In a second embodiment, an organic light emitting diode (OLED) display device includes a plurality of scan lines, a plurality of data lines, and a driver chip. The scan lines are configured to receive a scan signal. The data lines are configured to receive a data signal. The driver chip is connected with the scan lines and the data lines, and is configured to generate the scan signal and the data signal. A plurality of connection lines connected the driver chip with the data lines and scan lines are led out from a side of the driver chip.

In one embodiment of the OLED display device, the driver chip is an integrated chip, and the driver chip comprises a plurality of driving units that are arranged on a same side of the OLED display device.

In one embodiment of the OLED display device, the driver chip comprises a source driver configured to output the data signal, and a gate driver configured to output the scan signal, wherein the data lines are connected with the source driver, and the scan lines are connected with the gate driver.

In one embodiment of the OLED display device, the connection lines comprises a plurality of scan connection lines for connecting the driver chip with the scan lines, a plurality of first terminals of the scan connection lines are connected with the driver chip, and a plurality of second terminals of the scan connection lines are connected with the scan lines.

In one embodiment of the OLED display device, the connection lines comprises a plurality of scan connection lines, and each scan connection line comprises a horizontal portion parallel to the scan lines, and a vertical portion parallel to the data lines.

In one embodiment of the OLED display device, the driving units comprises at least one primary driving unit and at least one secondary driving unit, and the at least one primary driving unit and the at least one secondary driving unit are symmetrically arranged each other based on a central axis along a vertical direction of the display device.

In one embodiment of the OLED display device, each of the scan lines corresponds to a primary driving unit and a secondary driving unit, the at least one primary driving unit is connected with a scan line through a primary scan connection line, and the at least one secondary driving unit is connected with the scan line through a secondary scan connection line, wherein a first terminal of the scan line is connected with a terminal of the primary scan connection line, and a second terminal of the scan line is connected with a terminal of the secondary scan connection line.

In one embodiment of the OLED display device, the secondary scan connection line and the primary scan connection line are symmetrically arranged based on the central axis along the vertical direction of the display device.

In one embodiment of the OLED display device, a type of the OLED display device comprises a top emitting type or a bottom emitting type.

In one embodiment of the OLED display device, the driver chip is an integrated chip that outputs the scan signal and the data signal.

In the OLED display device of the present disclosure, because the gate driver chip and the source driver chip are arranged in an integrated chip, and the integrated chip is arranged in a same side of the display device, therefore, scan connection lines of the scan lines and connection lines of the data lines are led out from a side of the integrated chip, such that the a non-display area of the display device is reduced, thereby decreasing the frame size of the display device.

DETAILED DESCRIPTION OF PREFERRED EMBODIMENTS

The following embodiments refer to the accompanying figures for exemplifying specific implementable embodiments of the present disclosure in a suitable computing environment. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures use the same reference numbers.

Figure 1:
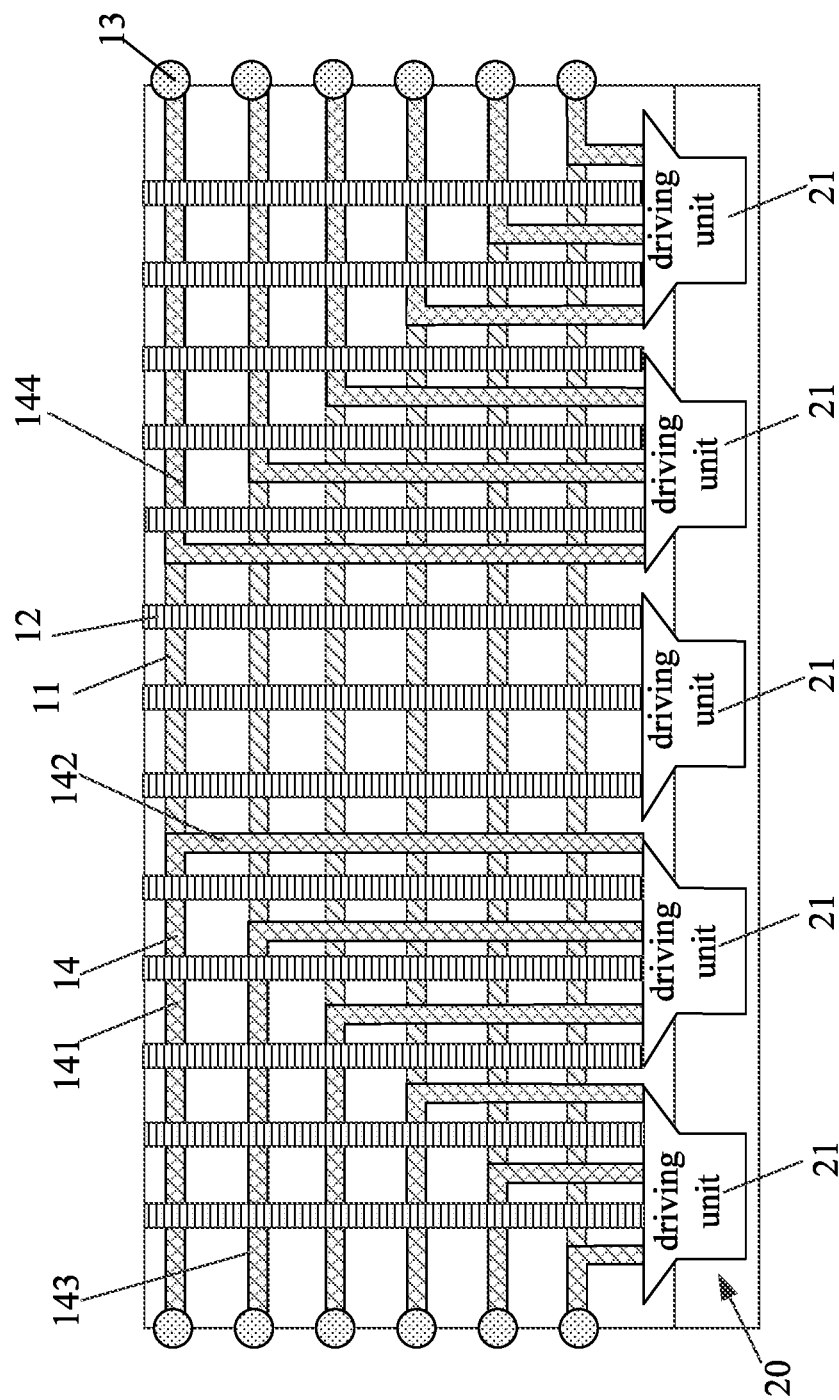
FIG. 1 is an illustrative structural diagram of an organic light emitting diode (OLED) display device according to one embodiment of the present disclosure.

In an embodiment, as shown in FIG. 1, an organic light-emitting diode display device includes a plurality of scan lines 11, a plurality of data lines 12, and a driver chip 20. The scan lines 11 are configured to receive a scan signal, and the data lines are configured to receive a data signal.

The driver chip 20 is connected with the scan lines and the data lines, and is configured to generate the scan signal and the data signal. For example, the driver chip 20 is an integrated chip including source drivers and gate drivers. In one embodiment, the driver chip 20 can output the scan signal and the data signal simultaneously. In another embodiment, the driver chip 20 can output the scan signal and the data signal separately. In other words, the driver chip 20 can output the scan signal and the data signal independently.

The driver chip 20 is connected with the data lines 12 and the scan lines 11. A plurality of connection lines are configured to connect the driver chip 20 with the data lines 12 and scan lines 11, and are led out from a side of the driver chip 20. For example, when the driver chip 20 is arranged under the OLED display device, the connection lines between the driver chip 20 and the data lines 12 are led from a lower portion of the display device. The connection lines between the driver chip 20 and the scan lines 11 are also led out from the lower portion of the display device.

On one hand, the connection lines of the scan lines 11 and the data lines 11 are led from the side of the driver chip 20, such that a wiring area of the OLED display device can be reduced. In other words, a non-display region of the OLED display device is decreased, and a frame size of the OLED display device is reduced. On the other hand, because the driver chip 20 is an integrated chip, and when a resolution ratio of the OLED display device is higher and a panel size of the display device is smaller, a problem that distance between structures of chip on films (COF) is not enough can be solved, thereby improving connection stability of signal lines of the OLED display device.

In one embodiment, the driver chip 20 includes a plurality of driving units 21 that are arranged on a same side of the OLED display device. For example, the driving units 21 are arranged under the OLED display device.

Figure 2:
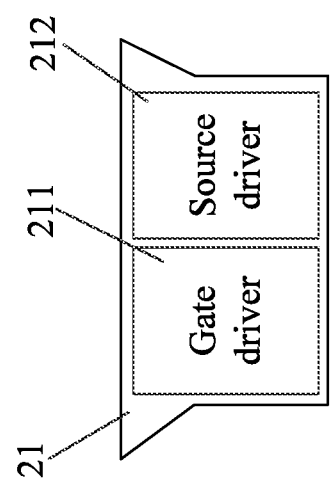
FIG. 2 is an illustrative structural diagram of a driver chip arranged in the OLED display device according to one embodiment of the present disclosure.

Referring to FIG. 1 and FIG. 2, when the driver chip 20 outputs the scan signal and the data signal independently, each driving unit 21 includes a gate driver 211 and a source driver 212. The data lines 12 are connected with the source driver 212, and the scan lines 11 are connected with the gate driver 211.

The connection lines include a plurality of scan connection lines 14 for connecting the driver chip 20 with the scan lines 11. A plurality of first terminals of the scan connection lines 14 are connected with the driver chip 20. A plurality of second terminals of the scan connection lines 14 are connected with first terminals of the scan lines 11. In other words, the connection lines include the scan connection lines 14.

In other words, the driving unit 21 is connected with the scan lines 11 through the scan connection lines 14, where first terminals of the scan connection lines 14 are connected with the driving unit 21, and second terminals of the scan connection lines 14 are connected with first terminals of the scan lines 11. For example, the second terminals of the scan connection lines 14 are connected with the first terminals of the scan lines 11 through via holes 13.

In one embodiment, the connection lines include a plurality of scan connection lines 14, and each scan connection line 14 includes a horizontal portion 141 parallel to the scan lines 11, and a vertical portion 142 parallel to the data lines 12. The vertical portion 142 and the data lines 12 are arranged at intervals.

The driving unit 21 includes at least one primary driving unit (e.g., two driving units on a left side) and at least one secondary driving unit (e.g., two driving units on a right side). For example, the at least one primary driving unit and the at least one secondary driving unit are symmetrically arranged each other based on a central axis along a vertical direction of the display device.

Each of the scan lines 11 corresponds to a primary driving unit and a secondary driving unit. The at least one primary driving unit is connected with a scan line 11 through a primary scan connection line 143. The at least one secondary driving unit is connected with the scan line 11 through a secondary scan connection line 144. A first terminal of each scan line is connected with a terminal of the primary scan connection line 143. A second terminal of the scan line is connected with a terminal of the secondary scan connection line 144. In other words, the primary scan connection line 143 is a scan connection line on the left side of the display device. The secondary scan connection line 144 is a scan connection line on the right side of the display device.

In one embodiment, the primary scan connection line 143 and the secondary scan connection line 144 are symmetrically arranged based on the central axis along the vertical direction of the display device.

In one embodiment, a type of the OLED display device includes a top emitting type or a bottom emitting type.

Figure 3:
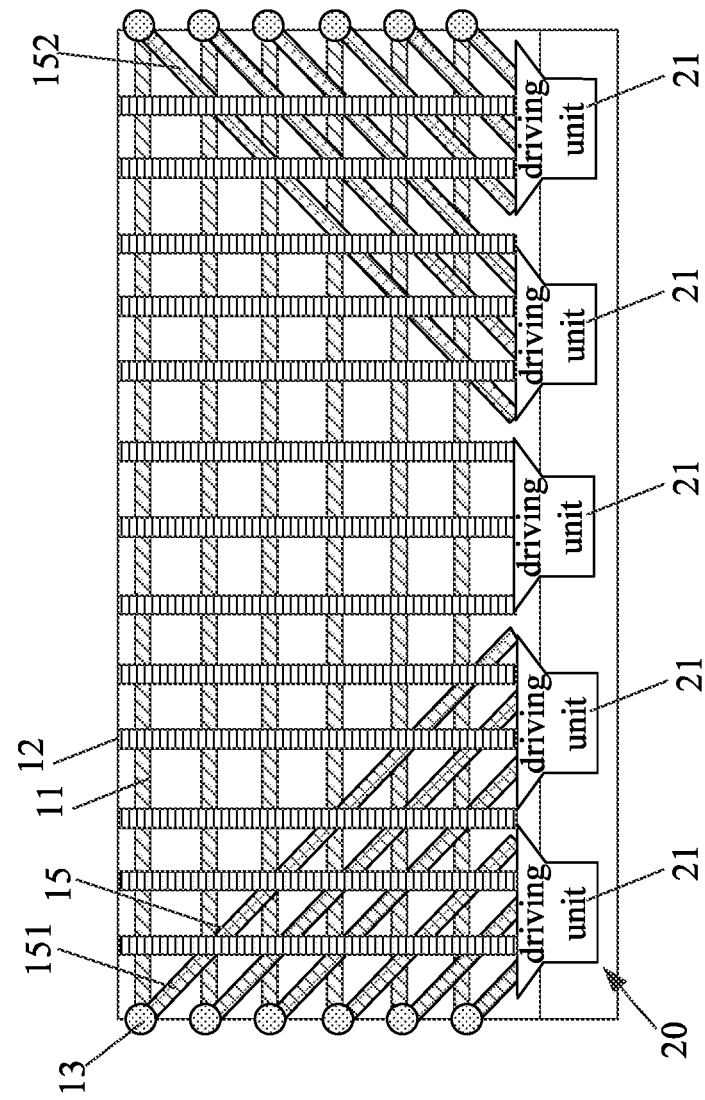
FIG. 3 is an illustrative structural diagram of the OLED display device according to another embodiment of the present disclosure.

In another embodiment, as shown in FIG. 3, an OLED display device includes a plurality of scan lines 11, a plurality of data lines 12, and a driver chip 20. The scan lines 11 are configured to receive a scan signal, and the data lines are configured to receive a data signal.

The driver chip 20 is connected with the scan lines and the data lines, and is configured to generate the scan signal and the data signal. For example, the driver chip 20 is an integrated chip including source drivers and gate drivers. In one embodiment, the driver chip 20 can output the scan signal and the data signal simultaneously. In another embodiment, the driver chip 20 can output the scan signal and the data signal separately. In other words, the driver chip 20 can output the scan signal and the data signal independently.

The driver chip 20 is connected with the data lines 12 and the scan lines 11. A plurality of connection lines are configured to connect the driver chip 20 with the data lines 12 and scan lines 11, and are led out from a side of the driver chip 20. For example, when the driver chip 20 is arranged under the OLED display device, the connection lines between the driver chip 20 and the data lines 12 are led from a lower portion of the display device. The connection lines between the driver chip 20 and the scan lines 11 are also led out from the lower portion of the display device.

On one hand, the connection lines of the scan lines 11 and the data lines 11 are led from the side of the driver chip 20, such that a wiring area of the OLED display device can be reduced. In other words, a non-display region of the OLED display device is decreased, and a frame size of the OLED display device is reduced. On the other hand, because the driver chip 20 is an integrated chip, and when a resolution ratio of the OLED display device is higher and a panel size of the display device is smaller, a problem that distance between structures of chip on films (COF) is not enough can be solved, thereby improving connection stability of signal lines of the OLED display device.

In one embodiment, the driver chip 20 includes a plurality of driving units 21 that are arranged on a same side of the OLED display device. For example, the driving units 21 are arranged under the OLED display device.

Referring to FIG. 1 and FIG. 2, when the driver chip 20 outputs the scan signal and the data signal independently, the driving unit 21 includes a gate driver 211 and a source driver 212. The data lines 12 are connected with the source driver 212, and the scan lines 11 are connected with the gate driver 211.

The connection lines include a plurality of scan connection lines 15 for connecting the driver chip 20 with the scan lines 11. A plurality of first terminals of the scan connection lines 15 are connected with the driver chip 20. A plurality of second terminals of the scan connection lines 15 are connected with first terminals of the scan lines 11. In other words, the connection lines include the scan connection lines 15.

In other words, the driving unit 21 is connected with the scan lines 11 through the scan connection lines 15, where first terminals of the scan connection lines 15 are connected with the driving unit 21, and second terminals of the scan connection lines 15 are connected with first terminals of the scan lines 11. For example, the second terminals of the scan connection lines 15 are connected with the first terminals of the scan lines 11 through via holes 13.

In one embodiment, a type of the OLED display device includes a top emitting type.

The driving unit 21 includes at least one primary driving unit (e.g., two driving units on a left side) and at least one secondary driving unit (e.g., two driving units on a right side). For example, the at least one primary driving unit and the at least one secondary driving unit are symmetrically arranged based on a central axis along a vertical direction of the display device.

Each of the scan lines 11 corresponds to a primary driving unit and a secondary driving unit. The at least one primary driving unit is connected with a scan line 11 through a primary scan connection line 151. The at least one secondary driving unit is connected with the scan line 11 through a secondary scan connection line 152. A first terminal of each scan line is connected with a terminal of the primary scan connection line 151. A second terminal of the scan line is connected with a terminal of the secondary scan connection line 152. In other words, the primary scan connection line 151 is a scan connection line on the left side of the display device. The secondary scan connection line 152 is a scan connection line on the right side of the display device.

In one embodiment, the primary scan connection line 151 and the secondary scan connection line 152 are symmetrically arranged based on the central axis along the vertical direction of the display device.

In one embodiment, the primary scan connection lines 151 are parallel to each other, and the secondary scan connection lines 152 are parallel to each other. A distance between every two adjacent primary scan connection lines 151 is equal, and a distance between every two adjacent secondary scan connection lines 152 is equal.

In the OLED display device of the present disclosure, because the gate driver chip and the source driver chip are arranged in an integrated chip, and the integrated chip is arranged in a same side of the display device, therefore, scan connection lines of the scan lines and connection lines of the data lines are led out from a side of the integrated chip, such that the a non-display area of the display device is reduced, thereby decreasing the frame size of the display device.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. An organic light emitting diode (OLED) display device, comprising:
    a plurality of scan lines configured to receive scan signals;
    a plurality of data lines configured to receive data signals; and
    a driver chip connected with the scan lines and the data lines, and generating the scan signals and the data signals, wherein a plurality of connection lines connected the driver chip with the data lines and scan lines are led out from a side of the driver chip, and the driver chip comprises a plurality of driving units that are arranged on a same side of the OLED display device;
    wherein the driving units comprise at least one primary driving unit and at least one secondary driving unit, and the at least one primary driving unit and the at least one secondary driving unit are symmetrically arranged based on a central axis along a vertical direction of the display device; and
    wherein the scan lines are arranged at a horizontal direction and an extension direction of the connection lines inclines to the scan lines at an acute angle in a display area, terminals of the connection lines are connected with terminals of the scan lines through via holes in the display area, the via holes are vertically arranged with each other, the via holes are formed on a same edge of the display area along a same vertical axis, and the same vertical axis is perpendicular to the scan lines.

2. The OLED display device according to claim 1, wherein the driver chip comprises a source driver configured to output the data signals, and a gate driver configured to output the scan signals, wherein the data lines are connected with the source driver, and the scan lines are connected with the gate driver.

3. The OLED display device according to claim 1, wherein the connection lines comprise a plurality of scan connection lines for connecting the driver chip with the scan lines, a plurality of first terminals of the scan connection lines are connected with the driver chip, and a plurality of second terminals of the scan connection lines are connected with the scan lines.

4. The OLED display device according to claim 1, wherein each of the scan lines corresponds to a primary driving unit and a secondary driving unit, the at least one primary driving unit is connected with a scan line through a primary scan connection line, and the at least one secondary driving unit is connected with the scan line through a secondary scan connection line, wherein a first terminal of the scan line is connected with a terminal of the primary scan connection line, and a second terminal of the scan line is connected with a terminal of the secondary scan connection line.

5. The OLED display device according to claim 4, wherein the secondary scan connection line and the primary scan connection line are symmetrically arranged based on the central axis along the vertical direction of the display device.

6. The OLED display device according to claim 1, wherein a type of the OLED display device comprises a top emitting type or a bottom emitting type.

7. The OLED display device according to claim 1, wherein the driver chip is an integrated chip that outputs the scan signal and the data signal.

8. An organic light emitting diode (OLED) display device, comprising:
    a plurality of scan lines configured to receive a scan signal;
    a plurality of data lines configured to receive a data signal; and
    a driver chip connected with the scan lines and the data lines, and generating the scan signal and the data signal, wherein a plurality of connection lines connected the driver chip with the data lines and scan lines are led out from a side of the driver chip; and
    wherein the scan lines are arranged at a horizontal direction and an extension direction of the connection lines inclines to the scan lines at an acute angle in a display area, terminals of the connection lines are connected with terminals of the scan lines through via holes in the display area, the via holes are vertically arranged with each other, the via holes are formed on a same edge of the display area along a same vertical axis, and the same vertical axis is perpendicular to the scan lines.

9. The OLED display device according to claim 8, wherein the driver chip is an integrated chip, and the driver chip comprises a plurality of driving units that are arranged on a same side of the OLED display device.

10. The OLED display device according to claim 9, wherein the driver chip comprises a source driver configured to output the data signal, and a gate driver configured to output the scan signal, wherein the data lines are connected with the source driver, and the scan lines are connected with the gate driver.

11. The OLED display device according to claim 8, wherein the connection lines comprises a plurality of scan connection lines for connecting the driver chip with the scan lines, a plurality of first terminals of the scan connection lines are connected with the driver chip, and a plurality of second terminals of the scan connection lines are connected with the scan lines.

12. The OLED display device according to claim 8, wherein the driving units comprise at least one primary driving unit and at least one secondary driving unit, and the at least one primary driving unit and the at least one secondary driving unit are symmetrically arranged based on a central axis along a vertical direction of the display device.

13. The OLED display device according to claim 12, wherein each of the scan lines corresponds to a primary driving unit and a secondary driving unit, the at least one primary driving unit is connected with a scan line through a primary scan connection line, and the at least one secondary driving unit is connected with the scan line through a secondary scan connection line, wherein a first terminal of the scan line is connected with a terminal of the primary scan connection line, and a second terminal of the scan line is connected with a terminal of the secondary scan connection line.

14. The OLED display device according to claim 13, wherein the secondary scan connection line and the primary scan connection line are symmetrically arranged based on the central axis along the vertical direction of the display device.

15. The OLED display device according to claim 8, wherein a type of the OLED display device comprises a top emitting type or a bottom emitting type.

16. The OLED display device according to claim 8, wherein the driver chip is an integrated chip that outputs the scan signal and the data signal.

* * * * *